(12) United States Patent
Schneegans et al.

(10) Patent No.: US 8,993,372 B2
(45) Date of Patent: Mar. 31, 2015

(54) METHOD FOR PRODUCING A SEMICONDUCTOR COMPONENT

(75) Inventors: Manfred Schneegans, Vaterstetten (DE); Carsten Ahrens, Pettendorf (DE); Adolf Koller, Regensburg (DE); Gerald Lackner, Arnoldstein (AT); Anton Mauder, Kolbermoor (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/407,731

(22) Filed: Feb. 28, 2012

(65) Prior Publication Data

US 2012/0225544 A1 Sep. 6, 2012

(30) Foreign Application Priority Data

Mar. 1, 2011 (DE) ...................... 10 2011 012 721.6

(51) Int. Cl.
| | |
|---|---|
| *H01L 21/00* | (2006.01) |
| *H01L 21/36* | (2006.01) |
| *H01L 21/02* | (2006.01) |
| *H01L 21/762* | (2006.01) |
| *H01L 29/861* | (2006.01) |

(52) U.S. Cl.
CPC .... *H01L 21/02658* (2013.01); *H01L 21/76202* (2013.01); *H01L 21/76224* (2013.01); *H01L 29/8611* (2013.01)
USPC ................................. 438/97; 438/57; 438/487

(58) Field of Classification Search
CPC ................. H01L 21/02691; H01L 21/02678; H01L 21/02686; H01L 21/2026; H01L 21/2636; H01L 21/268; H01L 21/67092; H01L 27/1285
See application file for complete search history.

(56) References Cited

U.S. PATENT DOCUMENTS

| | | | |
|---|---|---|---|
| 5,635,419 | A | 6/1997 | Geiss et al. |
| 7,304,005 | B2 | 12/2007 | Yamazaki et al. |
| 7,459,365 | B2 | 12/2008 | Rub et al. |
| 7,892,952 | B2 | 2/2011 | Yamazaki et al. |
| 2006/0211159 | A1* | 9/2006 | Bruederl et al. ................. 438/35 |
| 2008/0246055 | A1 | 10/2008 | Schulze et al. |
| 2009/0212396 | A1 | 8/2009 | Sugiura |
| 2011/0114855 | A1* | 5/2011 | Kawakami et al. ........ 250/492.2 |
| 2011/0129959 | A1* | 6/2011 | Moffatt ........................... 438/97 |
| 2012/0077315 | A1* | 3/2012 | Fukumitsu et al. ........... 438/114 |

\* cited by examiner

*Primary Examiner* — Brett Feeney
*Assistant Examiner* — Pamela E Perkins
(74) *Attorney, Agent, or Firm* — SpryIP, LLC

(57) ABSTRACT

Exemplary embodiments of a method for producing a semiconductor component having a polycrystalline semiconductor body region are disclosed, wherein the polycrystalline semiconductor body region is produced between the first and second surfaces of the semiconductor body in a semiconductor component section, wherein an electromagnetic radiation having a wavelength of at least 1064 nm is introduced into the semiconductor body in a manner focused onto a position in the semiconductor component section of the semiconductor body and wherein the power density of the radiation at the position is less than $1 \times 10^8$ W/cm$^2$.

22 Claims, 4 Drawing Sheets

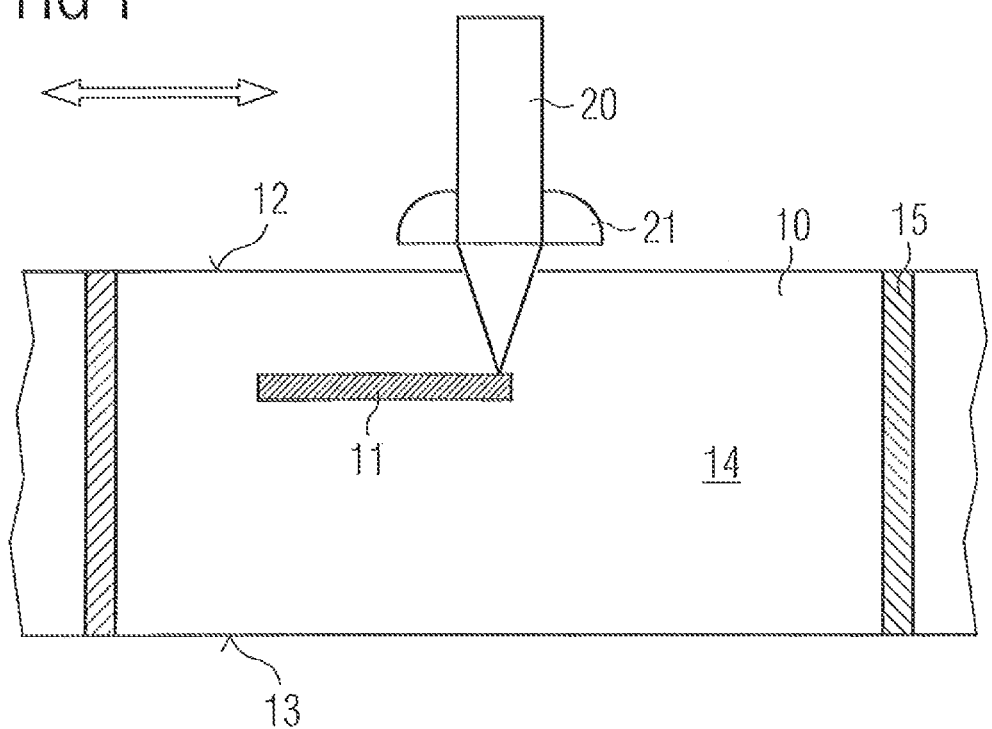
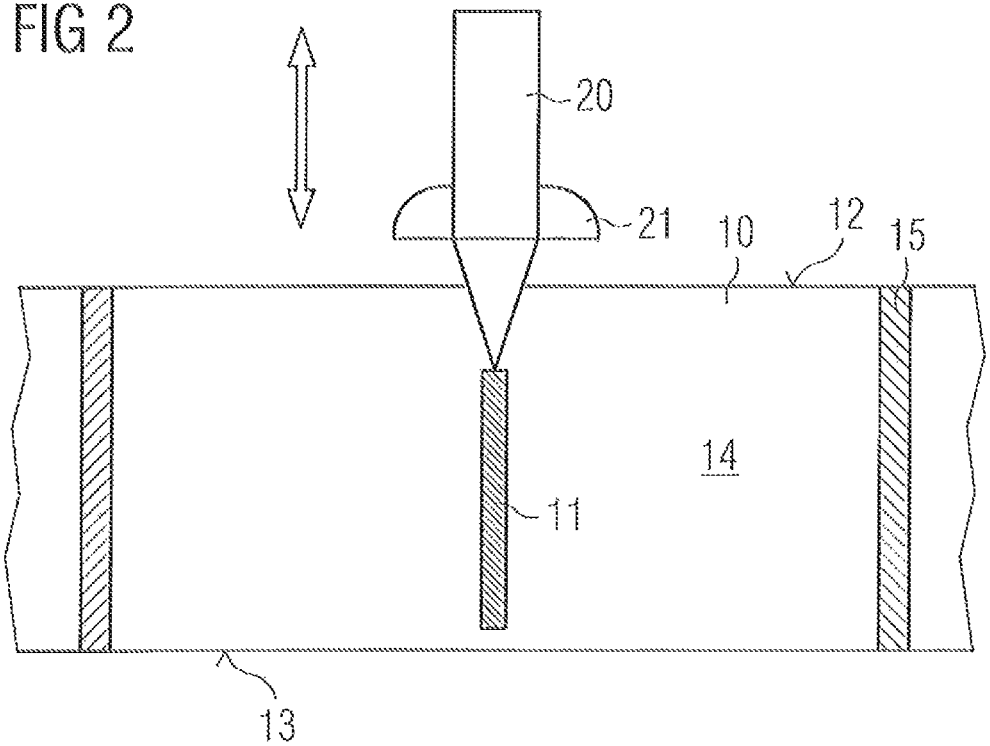

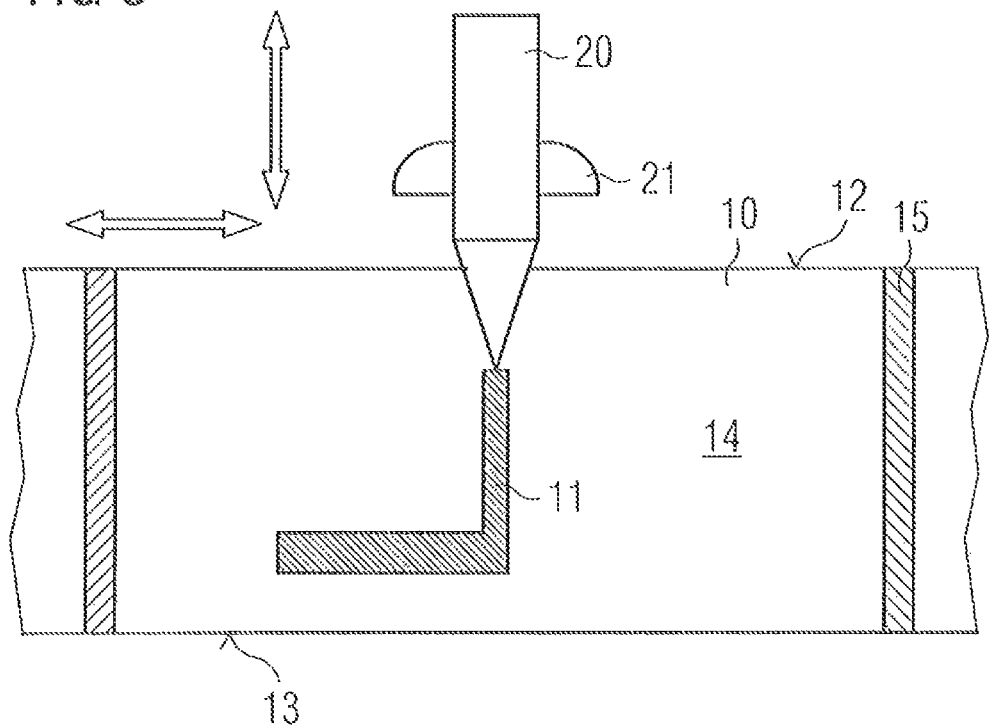
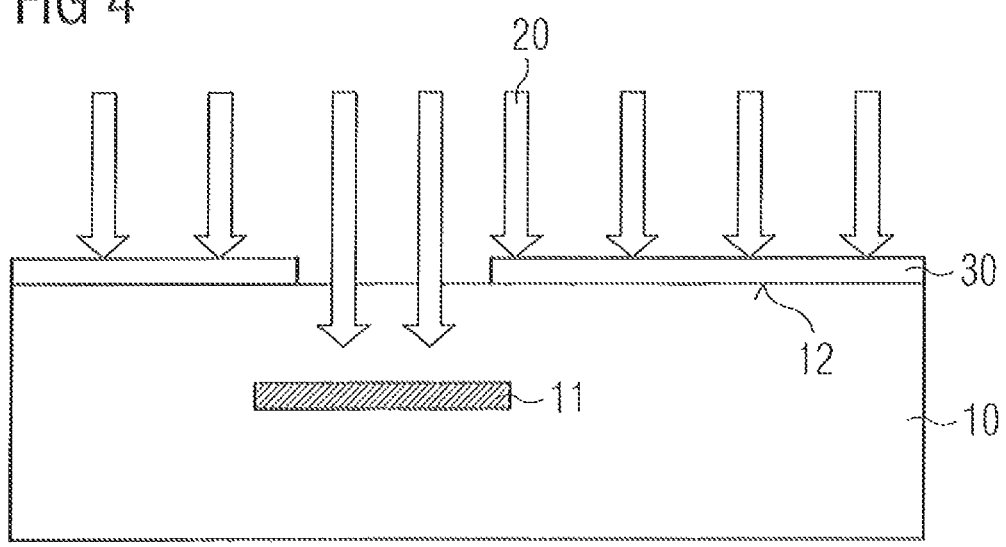

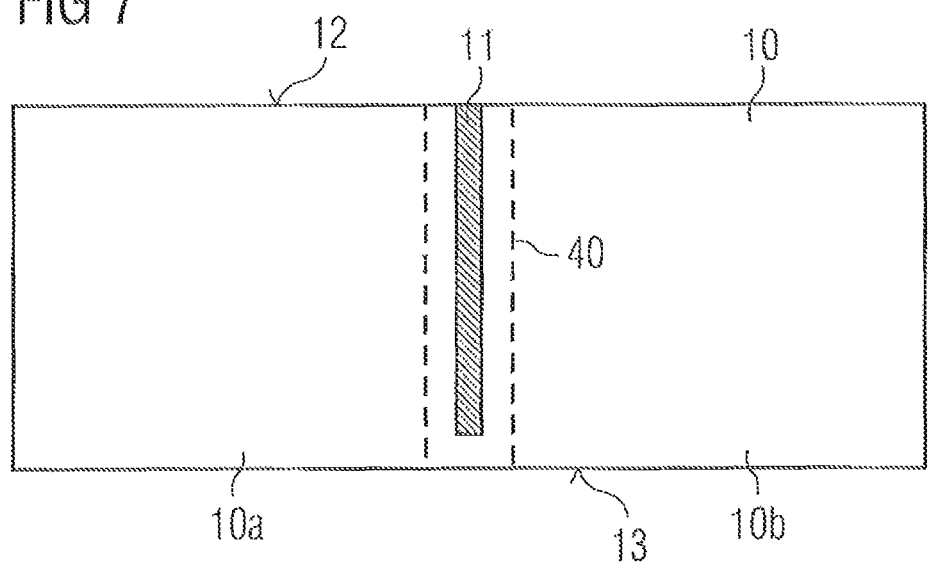
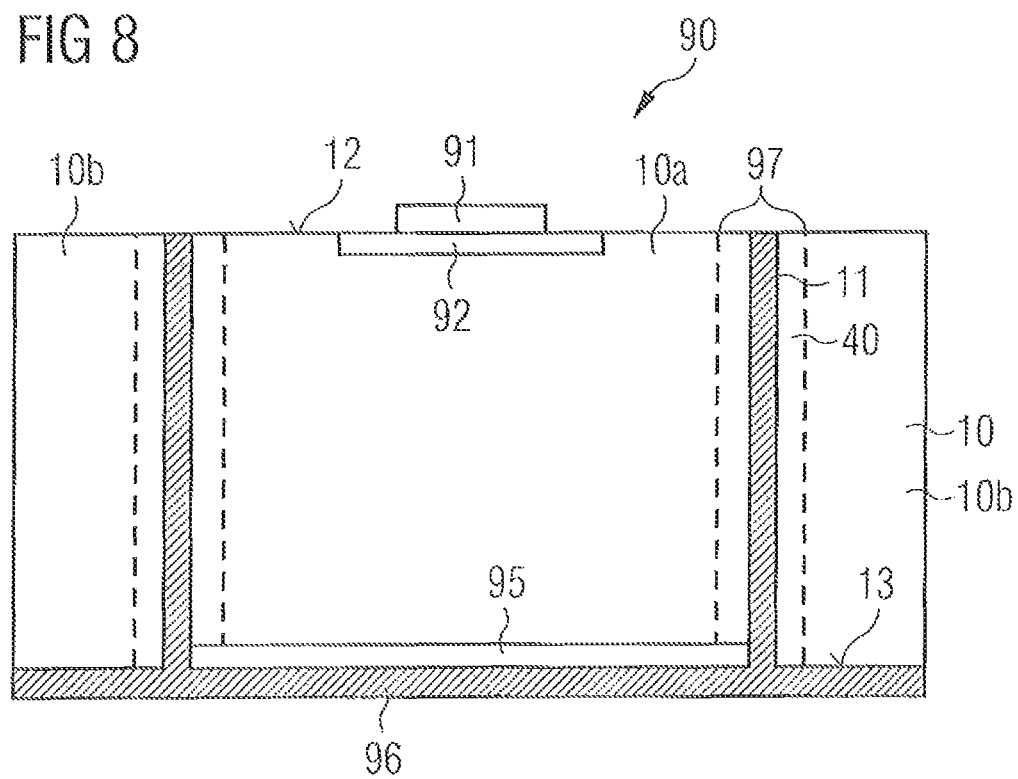

METHOD FOR PRODUCING A SEMICONDUCTOR COMPONENT

FIELD OF TECHNOLOGY

Exemplary embodiments of the invention relate to a method for producing a semiconductor component having a polycrystalline semiconductor body in a monocrystalline semiconductor body.

BACKGROUND

A polycrystalline semiconductor body is produced, for example, by polycrystalline deposition of a semiconductor material on a substrate.

A method for producing an amorphous or polycrystalline semiconductor body region in the sawing frame of a semiconductor body is described in US 2009/0212396 A1. The method explained therein provides for singulating a semiconductor body into different segments, wherein, as a result of the production of an amorphous or polycrystalline semiconductor body region in a separating region of the semiconductor body, a crack arises in the separating region of the semiconductor body. In this case, the crack forms in a manner proceeding from said amorphous or polycrystalline semiconductor body region in the separating region. The production of the amorphous or polycrystalline semiconductor body region is therefore intended to serve for breaking up the crystalline structure of the semiconductor body in order to divide the semiconductor body into individual semiconductor components.

For some applications such as e.g. as recombination region in a semiconductor component, polycrystalline structures would also be desirable within a semiconductor body of the semiconductor component. This applies in particular to applications in power semiconductor components such as diodes, MOS transistors, IGBTs, but also in radio-frequency circuits.

SUMMARY

One exemplary embodiment of a method for producing a semiconductor component having a polycrystalline semiconductor body region comprises the following features:
  providing a monocrystalline semiconductor body having a first surface, a second surface lying opposite the first surface, a semiconductor component section of the semiconductor body and, adjacent thereto, a separating region of the semiconductor body,
  producing a polycrystalline semiconductor body region between the first and second surfaces in the semiconductor component section, wherein an electromagnetic radiation having a wavelength of at least 1064 nm is introduced into the semiconductor body in a manner focused onto a position in the semiconductor component section of the semiconductor body, and wherein the power density of the radiation at the position is less than $1 \times 10^8$ W/cm$^2$,
  singulating the semiconductor component by severing the monocrystalline semiconductor body in the separating region from the first surface as far as the second surface.

BRIEF DESCRIPTION OF THE FIGURES

FIG. 1 shows the production of a lateral polycrystalline semiconductor body region in a semiconductor body by means of an electromagnetic radiation.

FIG. 2 shows the production of a vertical polycrystalline semiconductor body region in a semiconductor body by means of an electromagnetic radiation.

FIG. 3 shows the production of a continuous polycrystalline semiconductor body region having lateral and vertical sections.

FIG. 4 shows the production of a polycrystalline semiconductor body region in a semiconductor body by means of a mask.

FIG. 7 shows a continuous diffusion structure through a semiconductor body.

FIG. 8 shows a semiconductor component having continuous diffusion structures.

DETAILED DESCRIPTION

Figure 5A:
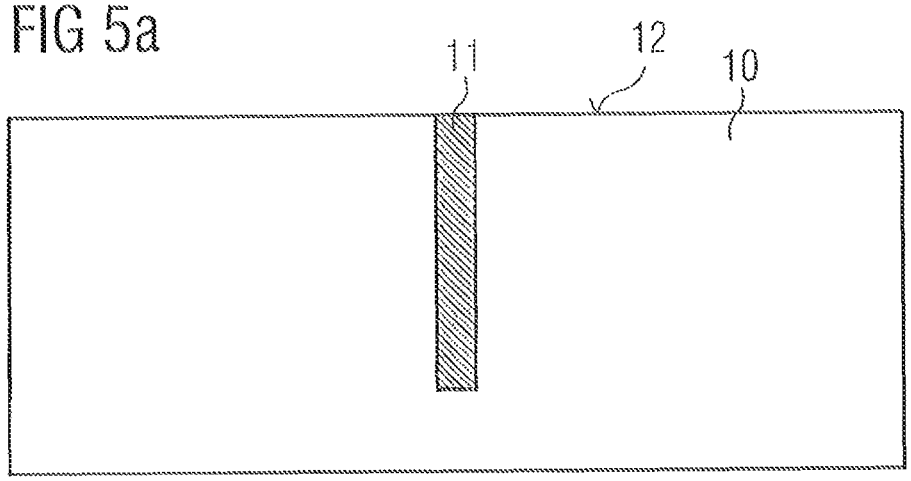
FIG. 5 shows the introduction of an impurity into a semiconductor body with the aid of schematic cross-sectional views in FIG. 5a and FIG. 5b.

Exemplary embodiments of the invention are explained in greater detail below, with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

Before the exemplary embodiments of the present invention are explained in greater detail below with reference to the figures, it is pointed out that identical elements in the figures are provided with the same or similar reference signs and that a repeated description of these elements is omitted. Furthermore, the figures are not necessarily true to scale. Rather, the main emphasis is on elucidating the basic principle.

FIG. 1 shows a basic embodiment of a method for producing a polycrystalline semiconductor body region. The polycrystalline semiconductor body region 11 is produced in a monocrystalline semiconductor body 10. The monocrystalline semiconductor body 10 provided for this purpose has a first surface 12 and a second surface 13 lying opposite the first surface 12. Furthermore, the semiconductor body is subdivided into semiconductor component sections 14 and into separating regions 15 adjacent thereto. In this case, the monocrystalline semiconductor body 10 can consist of any known semiconductor material such as silicon, for example. The monocrystalline semiconductor body 10 can be, for example, a conventional semiconductor wafer. However, it can also be just part of such a wafer.

The polycrystalline semiconductor body region 11 is produced by a focused electromagnetic radiation 20 having a wavelength of at least 1064 nm. For this purpose, the electromagnetic radiation 20 is introduced into the semiconductor component section 14 of the semiconductor body 10 in a manner focused onto a position at the depth T below the first surface 12, which leads to the conversion of the irradiated regions in the focus position from a monocrystalline structure into a polycrystalline structure. By way of example, a laser beam having a wavelength in the infrared range can be used as electromagnetic radiation 20. By way of example, the wavelength is in a range of between 1064 nm and 1342 nm.

The power density of the electromagnetic radiation 20 at the focus position is less than $1 \times 10^8$ W/cm$^2$. By way of example, the power density of the focused radiation at the focus position is in the range of between $1 \times 10^4$ W/cm$^2$ and $1\times10^8$ W/cm². Pulsed introduction of the electromagnetic radiation 20 into the semiconductor body 10 is possible.

As illustrated in this exemplary embodiment, a laterally oriented polycrystalline semiconductor body region 11 arises as a result of a lateral shift of the focus position in the semiconductor body 10, said shift running parallel to the first surface 12. The electromagnetic radiation 20 focused onto the focus position with the aid of a focusing device 21, for example a lens, is shifted laterally by a movement running parallel to the first surface 12 of the semiconductor body 10. By setting the focusing depth, it is possible to set the focus position and thus the vertical position of the polycrystalline semiconductor body region 11 in the semiconductor body 10. Typical focusing depths are, for example, in the range of 2 to 20 μm below the first surface 12 of the semiconductor body 10.

For singulating a semiconductor component, the semiconductor body 10 is severed in the separating region 15 in a vertical direction from the first surface 12 to the second surface 13.

In the exemplary embodiment in FIG. 2, the focus position of the electromagnetic radiation 20 is moved in a direction perpendicular to the surface 12 of the semiconductor body 10, thus giving rise to a vertical polycrystalline semiconductor body region 11. The focus position can be moved by shifting the entire focusing device 21 or by shifting the semiconductor body 10. The same effect could, for example, also be achieved by altering the focusing device 21 with regard to the focusing depth, as a result of which the focal point (focus position) of the focusing device 21 is shifted in a vertical direction and the vertical polycrystalline semiconductor body region 11 thus arises.

FIG. 3 illustrates a further exemplary embodiment, wherein the polycrystalline semiconductor body region 11 is implemented by moving the focus position in a lateral and a vertical direction in the semiconductor body 10. In the example, firstly a lateral part of the polycrystalline semiconductor body region 11 is produced by laterally shifting the focus position of the focused electromagnetic radiation 20. The focus position is then shifted in a vertical direction, as a result of which a vertically oriented part of the polycrystalline semiconductor body region 11 arises. Any other forms of polycrystalline semiconductor body regions 11 could also be produced in the semiconductor body 10 through combination of vertical and lateral movement of the focus position.

FIG. 4 shows a further example for producing a polycrystalline semiconductor body region 11 in the semiconductor body 10. For this purpose, the electromagnetic radiation 20 is introduced into the semiconductor body 10 in locally delimited fashion with the aid of a mask 30. The mask 30 prevents the electromagnetic radiation 20 from penetrating into the semiconductor body 10 in those regions of the semiconductor body 10 which are covered by the mask 30. It is only in those regions of the semiconductor body 10 in which the polycrystalline semiconductor body regions 11 are intended to be formed that the electromagnetic radiation 20 is enabled to penetrate through an opening in the mask 30. A combination with the above-described method, wherein the electromagnetic radiation 20 is focused onto a focus position by means of a focusing device 31, is possible. By means of the mask 30, the dimensions of the electromagnetic radiation 20 can be chosen independently of the structure size of the polycrystalline semiconductor body region 11. In particular, the electromagnetic radiation 20 can be used with larger area with e.g. a rectangular, elliptic or linear cross section, in order to reduce the process time and to enable a high positional accuracy of the polycrystalline semiconductor body region 11 produced.

Materials having strong absorption of the electromagnetic radiation 20, e.g. very highly doped semiconductor materials, are appropriate as mask 30. Said materials can be produced at the first surface 12 of the semiconductor body 10, e.g. by introducing the dopant into the first surface 12 of the semiconductor body 10 or by depositing and patterning a highly doped semiconductor layer on the first surface 12 of the semiconductor body 10. In the case of the dimensioning of the mask 30, it should be taken into consideration that the latter can heat up greatly as a result of heating during the irradiation.

Alternatively, it is also possible to use a mask 30 that reflects the electromagnetic radiation 20. By way of example, the mask 30 could be a metal. A buffer or adhesion layer such as e.g. $SiO_2$, $Si_3N_4$ can also be formed between the mask 30 and the semiconductor body 10, in order to be able to produce the compatibility with the overall process used for the further processing of the semiconductor body 10. It is also possible to use layer structures composed of different reflective and/or absorbent materials as mask 30. In the case of the dimensioning of the mask opening, the incidence characteristic of the electromagnetic radiation 20 should be taken into consideration. Since the electromagnetic radiation 20 can enter at different angles and the desired production of the polycrystalline semiconductor body region 11 is effected only at the focal point, which lies in a focus position within the semiconductor body 10, the mask opening should be somewhat larger than the polycrystalline semiconductor body region 11 to be produced. The minimum mask opening is limited by the wavelength of the electromagnetic radiation 20 and by the diffraction effects that occur. In the event of the minimum mask opening being undershot, the formation of punctiform polycrystalline semiconductor body regions can otherwise also occur below the mask 30. The occurrence of such undesirable structures below the mask 30 can be reduced by suitable mask design, such as e.g. phase shift masks.

FIG. 5 shows an exemplary embodiment of a method for introducing an impurity into a semiconductor body. In this case, the method utilizes the polycrystalline semiconductor body region 11 for introducing the impurity. FIG. 5a in this case illustrates an intermediate result, wherein the polycrystalline semiconductor body region 11 was produced in a monocrystalline semiconductor body 10 according to the method described above.

The polycrystalline semiconductor body region 11 produced has, in comparison with the monocrystalline semiconductor body 10, a higher diffusion length for the impurity to be introduced. The diffusion length is proportional to the diffusion constant D of the impurity in the respective solid and is in the following ratio thereto:

$$\text{Diffusion length} \sim \sqrt{D^*t}, \text{where } t = \text{diffusion time.}$$

The polycrystalline semiconductor body region 11 has many locally delimited crystal grains having grain boundaries therebetween. Along such grain boundaries, an impurity such as, for example, dopants such as boron or phosphorus or else oxygen can diffuse more rapidly than in monocrystalline regions of the semiconductor body 10. That is owing to the higher diffusion lengths along the grain boundaries.

As can be seen from FIG. 5a, the polycrystalline semiconductor body region 11 can be produced in such a way that the polycrystalline semiconductor body region 11 extends from a surface of the semiconductor body 10 into the semiconductor body 10. This has the advantage that the impurity to be introduced into the semiconductor body 10 can be provided at the surface of the semiconductor body 10. This can be done, for example, by providing the impurity as a solid layer (e.g. doped glass) at the first surface 12 of the semiconductor body 10. Alternatively, however, the impurity can also be provided in gaseous form at the first surface 12 of the semiconductor body 10. Another possibility is to implant the impurity into the polycrystalline semiconductor body region 11. The impurity can either be introduced over the whole area via the first surface 12 into the semiconductor body 10 and in particular into the polycrystalline semiconductor body region 11 or e.g. through a mask only in locally delimited fashion into the polycrystalline semiconductor body region 11.

Figure 5B:
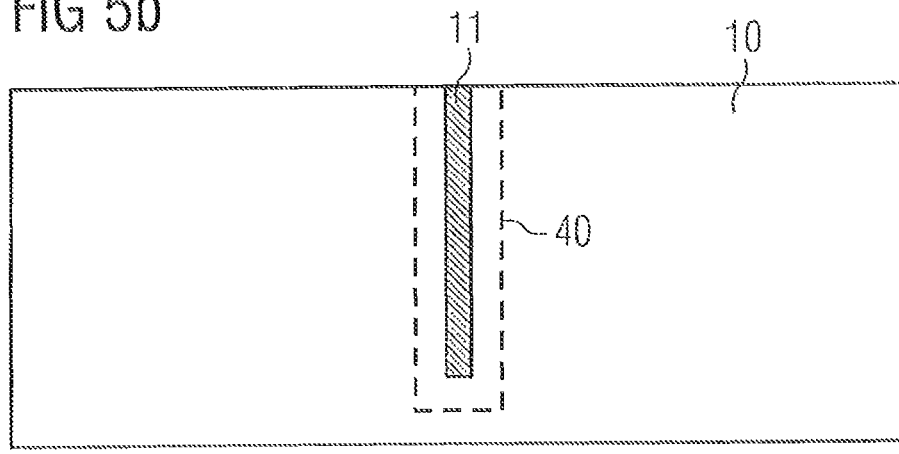

FIG. 5b shows the result wherein, after the impurity has been provided in the polycrystalline semiconductor body region 11, the semiconductor body 10 with the polycrystalline semiconductor body region 11 produced therein is heated, wherein the impurity diffuses along the polycrystalline semiconductor body region 11. In this case, the diffusion of the impurity along the polycrystalline semiconductor body region 11 takes place more rapidly than the diffusion of the impurity from the polycrystalline semiconductor body region 11 into the semiconductor body 10. Consequently, particularly in the case of an elongate extent of the polycrystalline semiconductor body region 11, an elongate distribution of the impurity in the polycrystalline semiconductor body region 11 arises. As a result of the slower outdiffusion of the impurity into the semiconductor body 10, at the side walls of the polycrystalline semiconductor body region 11 an impurity region 40 configured in elongate fashion likewise arises in the semiconductor body 10. Various forms of elongate extents of the polycrystalline semiconductor body region 11 can be formed. Elongate extent is intended here to be understood to be in each case a structure in which an extent in one spatial direction is longer than an extent in a spatial direction orthogonal thereto.

Figure 6:
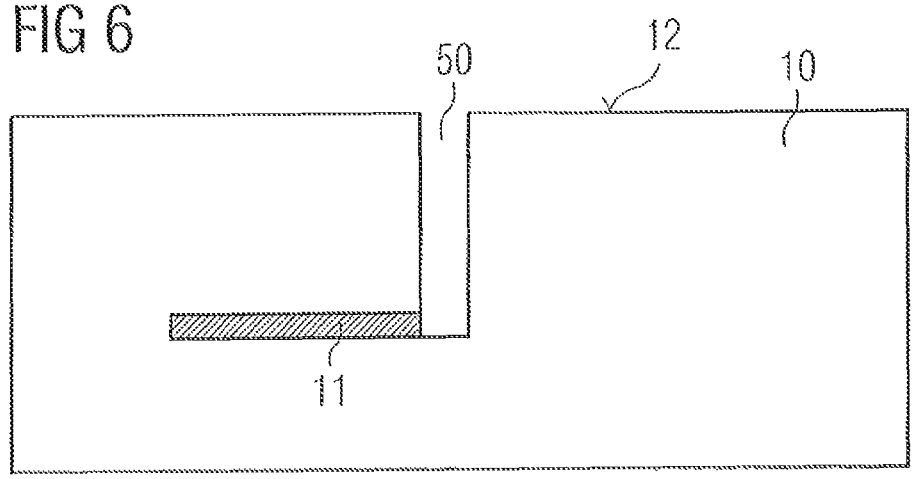
FIG. 6 shows a lateral polycrystalline semiconductor body region adjacent to a trench in a semiconductor body.

As illustrated in FIG. 6, the impurity to be introduced can be fed to a polycrystalline semiconductor body region 11 buried in the semiconductor body 10 with the aid of a trench 50. In this case, the trench 50 extends from a surface 51 at least as far as the buried polycrystalline semiconductor body region 11. In this case, the impurity can be fed e.g. in gaseous form via the trench to the polycrystalline semiconductor body region 11. The rapid diffusion of the impurity as already described then takes place in the polycrystalline semiconductor body region 11.

Another use of this exemplary embodiment in accordance with FIG. 6 might be if the trench 50 is utilized as an isolation trench relative to an adjacent region, e.g. as a shallow trench isolation. In this case, the polycrystalline semiconductor body region 11 prevents the undesirable diffusion of charge carriers into the semiconductor body region bounded by the trench 50. In this case, the polycrystalline layer can be arranged at any desired depth in the semiconductor body 10. For some applications it can be advantageous if the polycrystalline semiconductor body region 11 is arranged more deeply e.g. than a space charge zone in the region bounded by the trench 50. One application might be, for example, an integrated radio-frequency circuit in which charge carrier accumulation at the semiconductor body surface is intended to be prevented.

FIG. 7 shows an embodiment variant of the method for introducing an impurity into a semiconductor body, wherein the semiconductor body 10 is thinned at a rear side 13 of the semiconductor body. The thinning is effected, for example, by mechanical removal such as grinding and/or polishing. However, it can also be effected by chemical/electrochemical removal. The removal methods can also be applied in combination. In the example shown in FIG. 7, the thinning is effected at least until the rear side 13 reaches the impurity region 40. The impurity region 40 extending from the surface 12 as far as the rear side 13 and the polycrystalline semiconductor body region 11 thus separate the semiconductor body 10 into two parts 10a and 10b. If the impurity used is, for example, a substance that forms an insulation region in the semiconductor body 10, then as a result of the thinning of the semiconductor body 10 as far as said insulation region, the semiconductor body 10 is separated into semiconductor body parts 10a and 10b electrically isolated from one another. In the case of a silicon semiconductor body, the impurity used can be oxygen, for example, which together with the silicon semiconductor body forms an $SiO_2$ insulation layer. In order to produce an insulation layer, however, it is also possible to use a dopant as impurity which together with the doping of the semiconductor body 10 forms a blocking pn junction. With the use of an impurity that forms an electrically conductive region in the semiconductor body 10, it is also possible to realize an electrical through-plating from the surface 12 as far as the rear side 13 of the semiconductor body 10.

Exemplary applications of the presented method for introducing an impurity into a semiconductor body are:

Forming an insulation layer between two semiconductor body regions, in particular a lateral isolation of integrated circuits, wherein trenches for a dielectric isolation can be obviated and can be replaced for example by a junction isolation.

Forming a connection for a buried dopant region for example in an integrated circuit. The connection, e.g. a sinker, can in this case have a very low lateral outdiffusion.

Producing a through-plating through a semiconductor body, as is required e.g. for drain-up or source-down semiconductor components or for semiconductor components that effect blocking on both sides.

Forming a dopant column for example for superjunction semiconductor components.

Forming deeply extending insulation layers such as are required e.g. in novel semiconductor components, comprising a drift zone, a drift control zone adjacent thereto, and an intervening accumulation dielectric.

An exemplary application of the method for introducing an impurity into a semiconductor body is illustrated in FIG. 8. The example shows a semiconductor body 10, e.g. an n-doped silicon substrate, with a high-voltage diode 90 formed therein. The high-voltage diode 90 comprises a cathode electrode 91 on a cathode connection region 92. The cathode connection region 92 and the cathode electrode 91 are formed at a first surface 12 of the semiconductor body 10. An anode region 95 with an anode electrode 96 fitted thereto is formed at a second surface 13 of the semiconductor body 10, said second surface lying opposite the first surface 12. In this case, the anode region 95 has a p-type doping and forms a pn junction with the n-doped silicon substrate. A diffusion region 97 produced according to the above-described method for introducing an impurity into the semiconductor body 10 extends through the semiconductor body 10, said diffusion region delimiting the high-voltage diode 90. In this case, the diffusion region 97, having a polycrystalline semiconductor body region 11 and a diffused impurity region 40, subdivides the semiconductor body 10 into a partial region 10a, in which the high-voltage diode is formed, and an adjacent partial region 10b of the semiconductor body 10.

The blocking pn junction of the high-voltage diode is situated between the anode and the n-doped substrate in FIG. 8. In the case of conventionally produced diodes, the anode is realized by means of the drive-in of a pn junction from the front side. As a result, at the edges of the p-type anode, a field boosting arises on account of the geometry effect of the doping. In the case of isolation-diffused edges, as produced by the diffusion region 97 in FIG. 8, the field boosting at the edges of the p-type anode is not provided. As a result of the geometry effect, the field strength is reduced in the off-state case. The highest field strength occurs at the cathodal surface. However, said field strength is not higher than in the homogeneous region of the anode. Edge terminations with isolation diffusion can be dimensioned significantly more easily than conventional edge terminations. Isolation diffusions furthermore find application in, for example, thyristors, GTOs, bipolar transistors, IGBTs or other high-voltage components.

The exemplary embodiments of the method for producing a semiconductor component comprise the features that a polycrystalline semiconductor body region is produced between the first and second surfaces in the semiconductor component section, wherein an electromagnetic radiation having a wavelength of at least 1064 nm is introduced into the semiconductor body in a manner focused onto a position in the semiconductor component section of the semiconductor body, and wherein the power density of the radiation at the position is less than $1 \times 10^8$ W/cm$^2$.

The choice of the power density of the electromagnetic radiation below $1 \times 10^8$ W/cm$^2$ makes it possible to produce a durable polycrystalline semiconductor body region within the semiconductor body which does not initiate stress-induced cracking within the semiconductor body. Rather, the polycrystalline semiconductor body region can be utilized as a functional region, for example as a recombination region or as a rapid diffusion region for an impurity, in the semiconductor body for a semiconductor component. In this case, the section of the semiconductor body with the polycrystalline semiconductor body region produced for the semiconductor component substantially comprises the active part of the semiconductor body, which carries current during the operation of the semiconductor component, and also an edge termination of the semiconductor component.

At the chosen wavelength of the electromagnetic radiation of more than 1064 nm, the electromagnetic radiation is not directly absorbed by the monocrystalline semiconductor body, but rather has non-linear absorption properties. The absorption of the electromagnetic radiation and thus the local energy input in the semiconductor body increase significantly at the focus position. As a result, the monocrystalline structure of the semiconductor body is modified in the focus position and converted into a polycrystalline structure. The crystalline bond is modified only in the focus position, while the irradiated region of the semiconductor body remote from the focus position remains unchanged. By way of example, a laser beam can serve as electromagnetic radiation. The wavelength of the laser beam can be in the infrared range of between 1064 nm and 1342 nm. The electromagnetic radiation can be introduced into the semiconductor body continuously or in pulsed fashion.

The electromagnetic radiation can be introduced into the semiconductor body in a manner focused onto a position at the depth T. In this case, the electromagnetic radiation can be introduced into the semiconductor body both through the first surface and through the second surface. By shifting the position continuously or in steps in a direction between the first and second surface and/or in a direction parallel to the first surface, it is possible to produce an extended polycrystalline semiconductor body region within the semiconductor body. This can be advantageous for example for the application of the polycrystalline semiconductor body region as a recombination zone below the edge termination of a power semiconductor component in and/or below the field stop. Another application might be the production of a recombination region based on the polycrystalline semiconductor body region around a critical component region in an integrated circuit. In this example, the polycrystalline semiconductor body region extending around the critical region, e.g. a power DMOS, prevents the injection of charge carriers into adjacent regions of the integrated circuit.

One embodiment of the method provides for the electromagnetic radiation to be introduced into the semiconductor body in locally delimited fashion with the aid of a mask. By way of example, the semiconductor body used is a silicon semiconductor body, wherein the choice of the semiconductor material is dependent on the respective boundary conditions.

One exemplary embodiment of the method is if a polycrystalline semiconductor body region is respectively produced in different semiconductor component sections of the semiconductor body, wherein the separating region is situated between the respective semiconductor component sections. As a result, a multiplicity of semiconductor components with polycrystalline semiconductor body regions produced therein can be singulated from a large semiconductor body, e.g. a wafer. One development of the method is if an impurity is provided in the polycrystalline semiconductor body region and the semiconductor body with the polycrystalline semiconductor body region produced therein is heated, wherein the impurity diffuses along the polycrystalline semiconductor body region. The polycrystalline semiconductor body region has a higher diffusion length than the monocrystalline semiconductor body. As a result, the impurity to be introduced can diffuse more rapidly along the polycrystalline semiconductor body region than in the monocrystalline semiconductor body. Short diffusion times can be achieved if the semiconductor body is heated at least up to a temperature in the range of 800° C. to 1200° C. In one embodiment, the heating is effected at least up to a temperature in the range of 900° C. to 1200° C.

In one embodiment of the method, the polycrystalline semiconductor body region is produced in such a way that the polycrystalline semiconductor body region extends from a surface of the semiconductor body into the semiconductor body. In particular as a result it is possible, for example, to provide the impurity at the surface of the semiconductor body.

In one embodiment, this can be done by providing the impurity as a solid layer at the surface of the semiconductor body. Alternatively, the semiconductor body can be provided in gaseous form at the surface of the semiconductor body. Another embodiment provides for the impurity to be implanted into the polycrystalline semiconductor body region.

By way of example, oxygen or a dopant for the semiconductor body can be provided as impurities. One embodiment provides for the impurity to diffuse from the polycrystalline semiconductor body region into the monocrystalline semiconductor body adjacent thereto.

What is claimed is:

1. A method for producing a semiconductor component, comprising:
   providing a monocrystalline semiconductor body having a first surface, a second surface lying opposite the first surface, a semiconductor component section of the semiconductor body and, adjacent thereto, a separating region of the semiconductor body,
   producing a polycrystalline semiconductor body region between the first and second surfaces in the semiconductor component section, wherein an electromagnetic radiation having a wavelength of at least 1064 nm is introduced into the semiconductor body in a manner focused onto a position in the semiconductor component section of the semiconductor body, and wherein the power density of the radiation at the position is less than $1\times10^8$ W/cm$^2$, and wherein the position is shifted in a lateral and/or vertical direction with respect to the monocrystalline semiconductor body, singulating the semiconductor component by severing the monocrystalline semiconductor body in the separating region from the first surface as far as the second surface.

2. A method according to claim 1, wherein a laser beam is used as electromagnetic radiation.

3. A method according to claim 2, wherein the laser beam has a wavelength in the infrared range.

4. A method according to claim 2, wherein the electromagnetic radiation is introduced into the semiconductor body in locally delimited fashion with the aid of a mask.

5. A method according to claim 1, wherein the electromagnetic radiation is introduced into the semiconductor body in a manner focused onto a position at a depth below the first surface of the semiconductor body.

6. A method according to claim 5, wherein the position of the focused electromagnetic radiation in the semiconductor body is shifted continuously or in steps.

7. A method according to claim 6, wherein the position is shifted by changing the depth in a direction between first and second surface.

8. A method according to claim 7, wherein the position is shifted along a direction parallel to the first surface.

9. A method according to claim 1, wherein the electromagnetic radiation is introduced into the semiconductor body in pulsed fashion.

10. A method according to claim 1, wherein the semiconductor body is a silicon semiconductor body.

11. A method according to claim 1, wherein a polycrystalline semiconductor body region is respectively produced in different semiconductor component sections of the semiconductor body, wherein the separating region is situated between the respective semiconductor component sections.

12. A method according to claim 1, wherein an impurity is provided in the polycrystalline semiconductor body region and the semiconductor body with the polycrystalline semiconductor body region produced therein is heated, wherein the impurity diffuses along the polycrystalline semiconductor body region.

13. A method according to claim 12, wherein a dopant for the semiconductor body is provided as impurity.

14. A method according to claim 12, wherein the impurity diffuses from the polycrystalline semiconductor body region into the monocrystalline semiconductor body adjacent thereto.

15. A method according to claim 12, wherein the semiconductor body with the polycrystalline semiconductor body region produced therein is heated at least up to a temperature in the range of 800° C. to 1200° C.

16. A method according to claim 1, wherein the power density of the focused electromagnetic radiation at the position of the focus is in the range of between $1\times10^4$ W/cm$^2$ and $1\times10^8$ W/cm$^2$.

17. A method according to claim 1, wherein the polycrystalline semiconductor body region is produced with a maximum extent of 10 µm in a lateral direction parallel to the first surface.

18. A method according to claim 1, wherein the polycrystalline semiconductor body region is produced with a maximum extent of the crystal grains in the range of 50 nm to 1 µm.

19. A method according to claim 1, wherein the produced polycrystalline semiconductor body region is completely surrounded by the provided monocrystalline semiconductor body.

20. A method according to claim 1, wherein the produced polycrystalline semiconductor body region is at least perpendicular to the first surface and the second surface, and wherein the produced polycrystalline semiconductor body region includes at least two surfaces that abut the monocrystalline semiconductor body.

21. A method according to claim 1, wherein the position is shifted in a lateral direction with respect to the monocrystalline semiconductor body.

22. A method according to claim 1, wherein the position is shifted in a vertical direction with respect to the monocrystalline semiconductor body.

\* \* \* \* \*